(12) United States Patent
Lam

(10) Patent No.: US 8,258,599 B2
(45) Date of Patent: Sep. 4, 2012

(54) ELECTRONICS PACKAGE WITH AN INTEGRATED CIRCUIT DEVICE HAVING POST WAFER FABRICATION INTEGRATED PASSIVE COMPONENTS

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 662 days.

(21) Appl. No.: 11/456,685

(22) Filed: Jul. 11, 2006

(65) Prior Publication Data

US 2007/0138572 A1    Jun. 21, 2007

Related U.S. Application Data

(63) Continuation-in-part of application No. 11/304,084, filed on Dec. 15, 2005, now abandoned.

(51) Int. Cl.
  *H01L 29/00* (2006.01)
  *H01L 23/34* (2006.01)
(52) U.S. Cl. ........................ 257/531; 257/724
(58) Field of Classification Search .................. 257/531, 257/532, 536, 724; 438/107, 109, 110, 329, 438/382, 957
See application file for complete search history.

(56) References Cited

U.S. PATENT DOCUMENTS

| | | | |
|---|---|---|---|
| 5,478,773 A | 12/1995 | Dow et al. | |
| 5,541,135 A | 7/1996 | Pfeifer et al. | |
| 6,008,102 A | 12/1999 | Alford et al. | |
| 6,075,712 A | 6/2000 | McMahon | |
| 6,091,144 A * | 7/2000 | Harada | 257/724 |
| 6,407,456 B1 | 6/2002 | Ball | |
| 6,444,517 B1 | 9/2002 | Hsu et al. | |
| 6,486,530 B1 * | 11/2002 | Sasagawa et al. | 257/532 |
| 6,538,313 B1 * | 3/2003 | Smith | 257/684 |
| 6,744,114 B2 | 6/2004 | Dentry et al. | |
| 6,780,677 B2 | 8/2004 | Imasu et al. | |
| 6,798,057 B2 * | 9/2004 | Bolkin et al. | 257/686 |
| 6,884,658 B2 | 4/2005 | Akram | |
| 6,890,829 B2 * | 5/2005 | Cheng et al. | 438/381 |
| 7,142,000 B2 | 11/2006 | Eldridge et al. | |
| 7,239,025 B2 | 7/2007 | Farrar | |
| 7,335,994 B2 * | 2/2008 | Klein et al. | 257/778 |
| 7,497,005 B2 | 3/2009 | Forbes et al. | |
| 7,932,590 B2 * | 4/2011 | Lam | 257/686 |
| 2002/0086533 A1 | 7/2002 | Jang et al. | |
| 2003/0020171 A1 | 1/2003 | Dutta et al. | |

(Continued)

FOREIGN PATENT DOCUMENTS

GB    2288074    10/1995

(Continued)

OTHER PUBLICATIONS

U.S. Appl. No. 11/304,084, Amendment and Response filed Nov. 9, 2007 to Non-Final Office Action mailed May 11, 2007, 15 pgs.

(Continued)

*Primary Examiner* — Hung Vu
(74) *Attorney, Agent, or Firm* — Fish & Richardson P.C.

(57) ABSTRACT

An apparatus and a method for producing passive components on an integrated circuit device. The integrtated circuit device has post wafer fabrication integrated passive components situated on the opposite substrate side of the device's integrated circuitry. Electrical contact pads of the passive components are configured to be coupled to the electronics package contact pads to complete the electronic package.

8 Claims, 4 Drawing Sheets

U.S. PATENT DOCUMENTS

| | | | |
|---|---|---|---|
| 2003/0045044 | A1 | 3/2003 | Dentry et al. |
| 2003/0077871 | A1 | 4/2003 | Cheng et al. |
| 2004/0036569 | A1 | 2/2004 | Tsai et al. |
| 2004/0041270 | A1 | 3/2004 | Shimizu et al. |
| 2004/0178473 | A1 | 9/2004 | Dentry et al. |
| 2005/0002167 | A1 | 1/2005 | Hsuan et al. |
| 2005/0046041 | A1 | 3/2005 | Tsai |
| 2005/0127397 | A1 | 6/2005 | Borges et al. |
| 2005/0133916 | A1 | 6/2005 | Karnezos |
| 2005/0253257 | A1 | 11/2005 | Chiu et al. |
| 2006/0011702 | A1 | 1/2006 | Funaya et al. |
| 2006/0027841 | A1 | 2/2006 | Tamaki |
| 2006/0245308 | A1* | 11/2006 | Macropoulos et al. ............ 369/1 |
| 2006/0286716 | A1 | 12/2006 | Takayama |
| 2007/0138572 | A1 | 6/2007 | Lam |
| 2007/0138628 | A1 | 6/2007 | Lam |
| 2008/0054428 | A1 | 3/2008 | Lam |
| 2009/0294957 | A1 | 12/2009 | Lam |

FOREIGN PATENT DOCUMENTS

| | | |
|---|---|---|
| WO | WO-00/54337 A1 | 9/2000 |
| WO | WO-2008/008581 A2 | 1/2008 |
| WO | WO 2008/008581 A3 | 1/2008 |
| WO | WO-2008/008587 A2 | 1/2008 |
| WO | WO 2008/008587 A3 | 1/2008 |

OTHER PUBLICATIONS

U.S. Appl. No. 11/304,084, Final Office Action mailed Feb. 21, 2008, 11 pgs.

U.S. Appl. No. 11/304,084, Non-Final Office Action mailed May 11, 2007, 12 pgs.

U.S. Appl. No. 11/457,409 Non-Final Office Action mailed Mar. 31, 2008, 19 pgs.

PCT Application No. PCT/US07/70612, International Search Report mailed Apr. 21, 2008, 2 pgs.

PCT Application No. PCT/US07/70612, Written Opinion Apr. 21, 2008, 10 pgs.

"U.S. Appl. No. 11/304,084, Non-Final Office Action mailed Aug. 5, 2008", 11 pgs.

"U.S. Appl. No. 11/304,084, Amendment and Response filed May 21, 2008 to Final Office Action mailed Feb. 21, 2008", 12 pgs.

"U.S. Appl. No. 11/457,409, Amendment and Response filed Jun. 27, 2008 mailed Mar. 31, 2008", 15 pgs.

"International Application Serial No. PCT/US2007/071079, International Search Report mailed May 16, 2008", 4 pgs.

"International Application Serial No. PCT/US2007/071079, Written Opinion mailed May 16, 2008", 5 pgs.

"U.S. Appl. No. 11/304,084, Final Office Action mailed Apr. 2, 2009", 10 pgs.

"U.S. Appl. No. 11/304,084, Response filed Jan. 5, 2009 to Non Final Office Action mailed Aug. 5, 2008", 13 pgs.

"U.S. Appl. No. 11/304,084, Response filed Apr. 17, 2007 to Restriction Requirement mailed Apr. 5, 2007", 1 pg.

"U.S. Appl. No. 11/304,084, Restriction Requirement mailed Apr. 5, 2007", 4 pgs.

"U.S. Appl. No. 11/457,409, Final Office Action mailed Feb. 24, 2009", 15 pgs.

"U.S. Appl. No. 11/457,409, Non-Final Office Action mailed Jul. 23, 2009", 13 pgs.

"U.S. Appl. No. 11/457,409, Preliminary Amendment filed Oct. 13, 2006", 3 pgs.

"U.S. Appl. No. 11/457,409, Response filed Feb. 25, 2008 to Restriction Requirement mailed Jan. 25, 2008", 7 pgs.

"U.S. Appl. No. 11/457,409, Response filed Jun. 24, 2009 to Final Office Action mailed Feb. 24, 2009", 13 pgs.

"U.S. Appl. No. 11/457,409, Response filed Dec. 1, 2008 to Restriction Requirement mailed Sep. 30, 2008", 8 pgs.

"U.S. Appl. No. 11/457,409, Restriction Requirement mailed Jan. 25, 2008", 6 pgs.

"U.S. Appl. No. 11/457,409, Restriction Requirement mailed Sep. 30, 2008", 6 pgs.

"U.S. Appl. No. 11/457,409, Response filed Oct. 23, 2009 to Non Final Office Action mailed Jul. 23, 2009", 10 pgs.

"U.S. Appl. No. 11/457,409, Non-Final Office Action mailed Apr. 19, 2010", 5 pgs.

"U.S. Appl. No. 11/457,409, Notice of Allowance mailed Dec. 30, 2009", 7 pgs.

U.S. Appl. No. 11/457,409 Notice of Allowance mailed Aug. 4, 2010, 7 pgs.

U.S. Appl. No. 11/457,409, Response filed Jul. 19, 2010 to Non Final Office Action mailed Apr. 19, 2010, 8 pgs.

U.S. Appl. No. 11/457,409, Response filed Jun. 27, 2008 mailed Mar. 31, 2008, 15 pgs.

U.S. Appl. No. 11/304,084, Amendment and Response filed Jan. 5, 2009 to Non-Final Office Action mailed Aug. 5, 2008, 13 pgs.

* cited by examiner

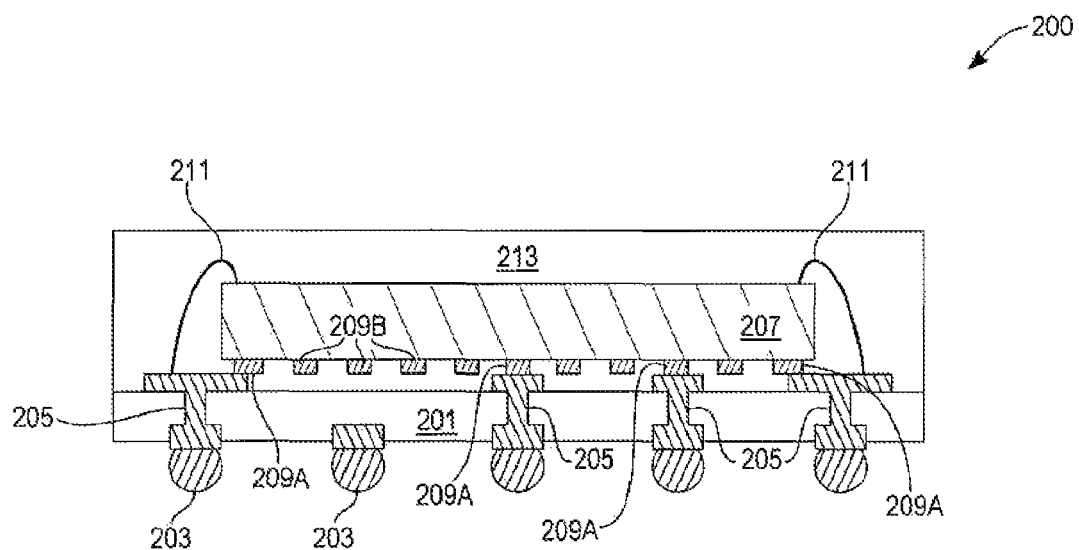
Fig._2
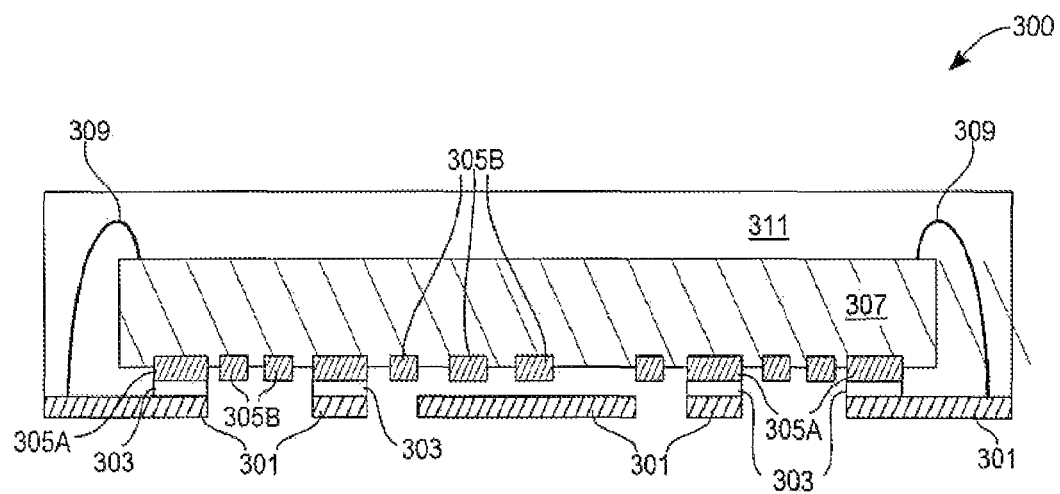
Fig._3

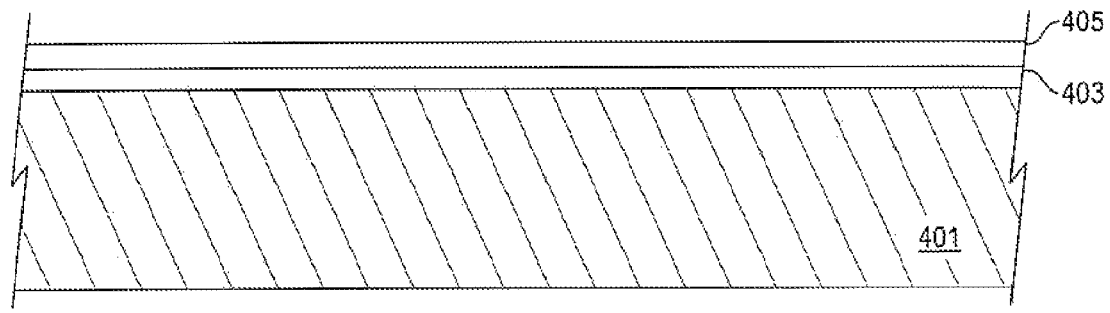
*Fig._4A*
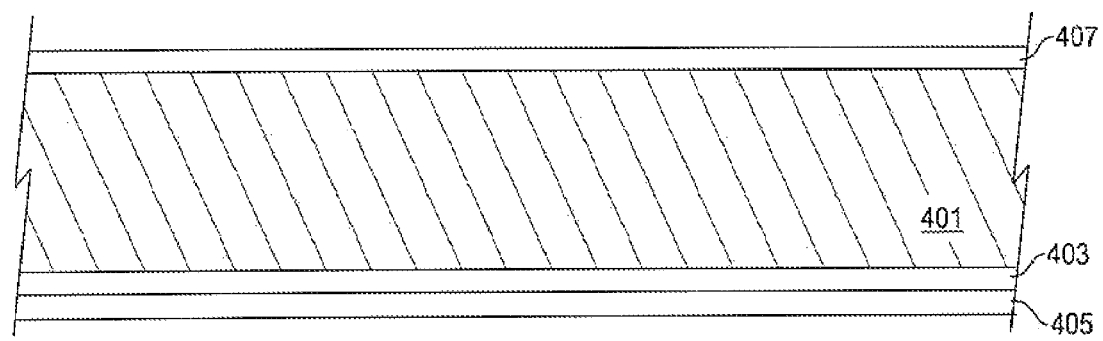
*Fig._4B*
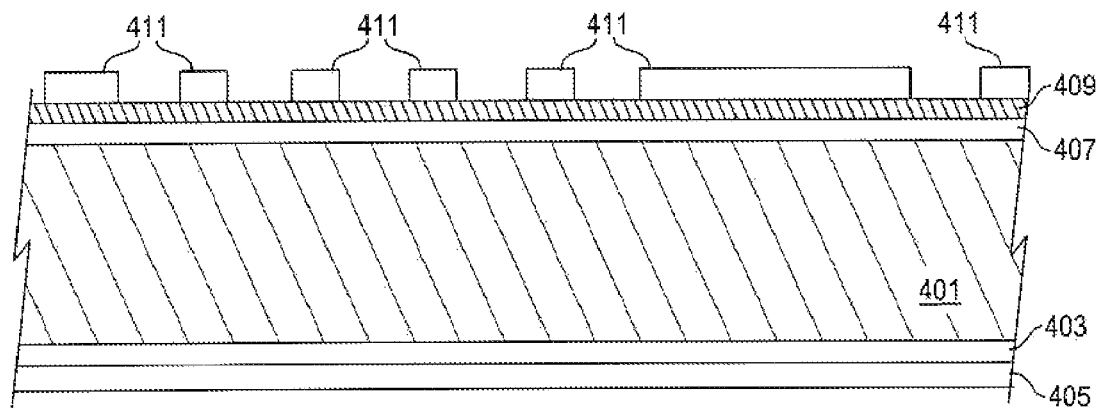
*Fig._4C*

ELECTRONICS PACKAGE WITH AN INTEGRATED CIRCUIT DEVICE HAVING POST WAFER FABRICATION INTEGRATED PASSIVE COMPONENTS

CROSS-REFERENCE TO RELATED APPLICATIONS

This application is a continuation-in-part (and claims the benefit of priority under 35 USC 120) of U.S. patent application Ser. No. 11/304,084, filed Dec. 15, 20053. The disclosure of the prior application is considered part of and is hereby incorporated by reference in the disclosure of this application.

TECHNICAL FIELD

The invention relates to an integrated circuit package, and more particularly, to incorporating passive components on a back side of a substrate having a fabricated integrated circuit device.

BACKGROUND ART

As electronic packages increase in required functionality as well as the number of functions an electronic package is expected to perform, passive components are frequently needed to accomplish specific circuit tuning. Circuit tuning either adds tunable characteristics to the package or enables the package to perform properly. Enabling proper performance is especially required in many radio-frequency (RF) applications. For example, high-Q inductors are frequently needed in RF applications.

Adding discrete passive components to electronic packages typically results in an increase in both the size and weight of the package. These increases counter contemporary goals of increased portability and miniaturization. Adding discrete passive components in electronic packages also requires a dedicated production line, frequently including surface mounting equipment and added process setups. The added equipment and processes increase both capital investment and assembly lead-time, resulting in higher product costs.

Currently, these problems are being addressed by fabricating passive components, (e.g., inductors, capacitors, and resistors) over the active circuitry of an integrated circuit device. Integrating passive components requires various fabrication methods such as thin-film, photolithographic, and plating processes. Vias are formed over a top passivation layer of an integrated circuit device thus allowing integrated passive components to connect to the underlying integrated circuitry elements.

Consequently, current solutions for adding passive components to an integrated circuit device require custom-designed contact via openings to be at the top passivation layer for each product device. If a product is not initially designed to accept passive components, they cannot be simply added to the device. Therefore, what is need is a simple, inexpensive, and reliable means to add passive components to any integrated circuit without requiring, for example, custom designed contact vias or precise photolithography.

SUMMARY

Embodiments of the present invention have integrated passive components formed on the back side of a substrate while integrated circuit devices are formed on the front side of the substrate. All operations may be carried out at the substrate (e.g., wafer) level prior to singulation of individual dice formed before package assembly. The die containing integrated circuit devices on the front side and integrated passive components on the back side is electrically connected to the substrate device circuitry and/or directly electrically connected to bond features of the packaging device itself. The electrical connections can be achieved by joining appropriate areas with, for example, solder, conductive polymer, or metal-to-metal bonding processes. An optional polymer material, such as epoxy or acrylic, can be used to fill any gaps between the individual die and the substrate of the packaging device to assist in further anchoring the integrated circuit device to the package substrate. The integrated circuit device will then undergo a standard wire bonding process to connect bond pads on the individual die to the package substrate.

Overall, no photolithographic processes are needed since no contact via holes are formed. Processing takes place on the smooth back side of a substrate so there are no topological issues. Consequently, quality and yield will be higher compared with integration of passive components on the front side (i.e., the active circuit side). Further, 100% of the back side of the substrate is available on which to fabricate passive components.

Accordingly, in one exemplary embodiment the present invention is an integrated circuit fabricated from a substrate having a front side and a back side. The front side of the substrate has one or more integrated circuit devices fabricated thereon. At least one passive component is fabricated onto the back side of the substrate. The passive component is comprised of a metal structure.

In another exemplary embodiment, the present invention is an electronics package. The electronics package includes a package substrate having a plurality of package substrate bond pads and an integrated circuit die. The integrated circuit die is fabricated from a substrate having a front side and a back side. One or more integrated circuit devices are fabricated on the front side of the substrate and a plurality of integrated circuit bond pads are fabricated on the integrated circuit devices. At least one passive component is fabricated onto the back side of the substrate. The passive component is comprised of a metal structure having a plurality of passive component bond pads. The bond pads are arranged to correspond to certain ones of the plurality of package substrate bond pads.

In another exemplary embodiment, the present invention is a method of forming one or more passive components on a substrate. The method includes forming at least one integrated circuit on a front side of a substrate, forming a photoresist layer over a back side of the substrate and patterning and etching the photoresist layer to form one or more passive component structures. The passive component structures are filled with metal.

BRIEF DESCRIPTION OF THE DRAWINGS

FIG. 2 is an integrated circuits die fabricated in accordance with methods of the present invention and mounted in a ball grid array (BGA) package.

FIG. 3 is an integrated circuit die fabricated in accordance with methods of the present invention and mounted in a Quad Flat-Pack No-Lead (QFN) package.

FIGS. 4A-4F are exemplary fabrication steps of an integrated circuit device produced in accordance with the present invention.

DETAILED DESCRIPTION

Figure 1:
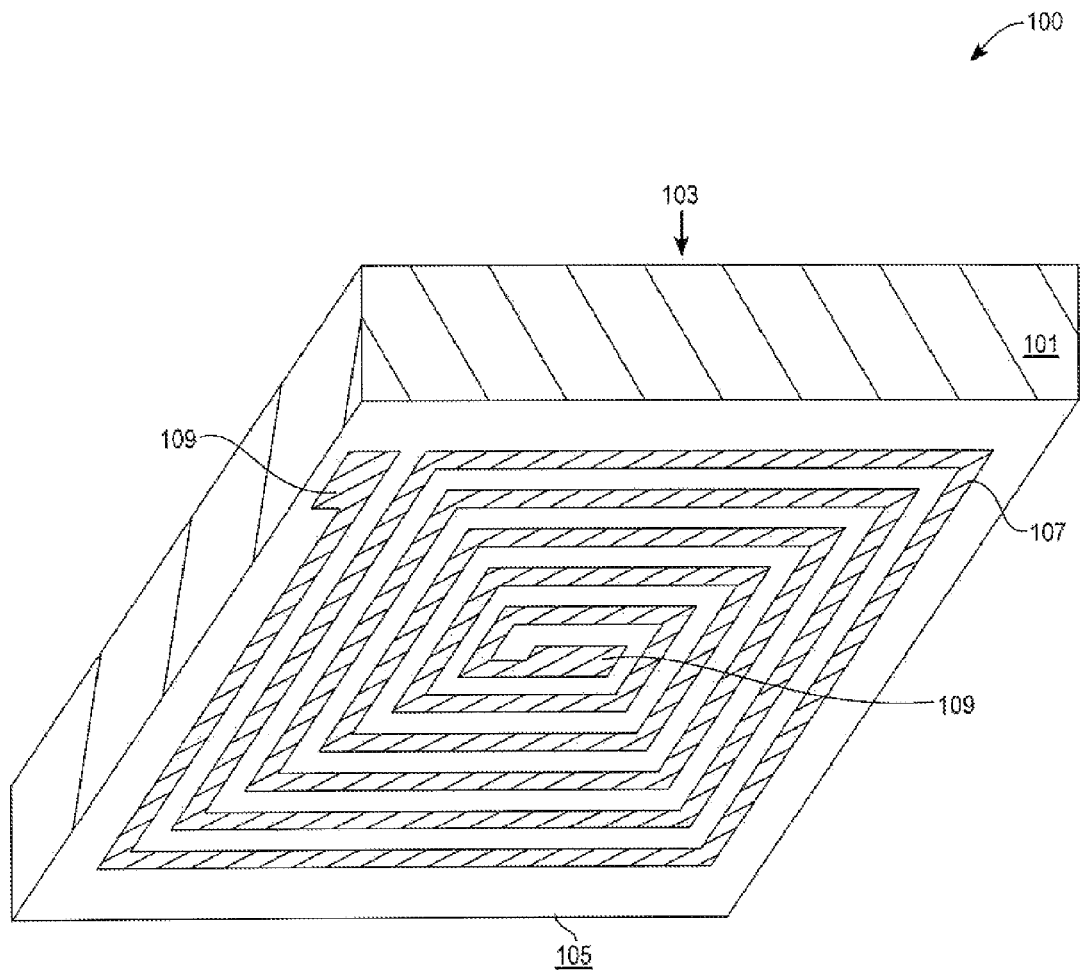
FIG. 1 is an isometric drawing of a passive element fabricated on a back side of an integrated circuit substrate in accordance with an exemplary embodiment of the present invention.

In FIG. 1, an integrated circuit die 100 includes a substrate 101 having a front side 103 and a back side 105. In a specific exemplary embodiment, the substrate 101 is portion of a silicon wafer. However, a skilled artisan will recognize that other semiconducting and non-semiconducting materials may be used instead of silicon for the substrate 101. Other semiconducting materials include, for example, elemental semiconductors such as germanium, compound semiconductors such as group III-V, and II-VI materials, and semiconducting alloys (e.g., $Al_xGa_{1-x}As$, $HG_{1-x}CD_xTe$). Additionally, non-semiconducting materials such as, for example, a polyethylene-terephthalate (PET) substrate deposited with silicon dioxide or a quartz photomask, each of which may be deposited with polysilicon followed by an excimer laser annealing (ELA) anneal step.

On the back side 105 of the substrate 101, one or more passive components are formed. In this exemplary embodiment, a large single inductor 107 is formed. The inductor 107 terminates with a bond pad 109 on either end. Techniques disclosed herein apply readily to various types of passive components (e.g., inductors, resistors, capacitors, etc.). The passive components may be fabricated individually or in various combinations and with varying sizes. FIG. 1 therefore should be viewed as merely illustrative only of a generalized concept to be described in greater detail below.

With reference to FIG. 2 a ball grid array (BGA) package 200 includes a BGA substrate 201, a plurality of BGA balls 203, and a plurality of BGA via connections 205. The BGA package type is generally known in the art. Mounted to the BGA substrate 201 is an integrated circuit die 207 fabricated in accordance with an exemplary embodiment of the present invention. The integrated circuit die 207 includes a plurality of passive component bond pads 209A and a plurality of passive components 209B fabricated on the back side of the integrated circuit die 207.

Electrical connections are made from the plurality of passive components 209B through the plurality of passive component bond pads 209A to the plurality of BGA vias 205 to the plurality of BGA balls 203. Connections between the plurality of passive component bond pads 209A and the plurality of BGA vias 205 occurs through, for example, conductive epoxy, solder, conductive polymers, metal-to-metal bonding, etc.

Integrated circuit devices (not shown) are fabricated on the front side of the integrated circuit die 207. A plurality of bond wires 211 connect the front side integrated circuit devices to the BGA substrate 201. The BGA substrate 201 and the integrated circuit die 207 are protected with an encapsulant 213.

In FIG. 3, a Quad Flat-Pack No-Lead (QFN) package 300 includes a QFN substrate 301 with a plurality of contact pads 303. The QFN package type is generally known in the art. Mounted to the QFN substrate 301 is an integrated circuit die 307 fabricated in accordance with an exemplary embodiment of the present invention. The integrated circuit die 307 includes a plurality of passive component bond pads 305A and a plurality of passive components 305B fabricated on the back side of the integrated circuit die 307. Electrical connections are made from the plurality of passive components 305B through the plurality of passive component bond pads 305A to the plurality of contact pads 303. Connections between the plurality of passive component bond pads 305A and the plurality of contact pads 303 are through, for example, conductive epoxy, solder, conductive polymers, metal-to-metal bonding, etc.

Integrated circuit devices (not shown) are fabricated on the front side of the integrated circuit die 307. A plurality of bond wires 309 connect the front side integrated circuit devices to the QFN substrate 301. The QFN substrate 301 and the integrated circuit die 307 are protected with an encapsulant 313.

Exemplary fabrication steps for producing integrated circuit dice according to various embodiments of the present invention are presented graphically with reference to FIGS. 4A-4F. Using the techniques disclosed, integrated passive components may be readily produced using, for example, thin-film and plating techniques on the back side of a substrate (such as, for example, a silicon wafer). The substrate is then singulated into individual dice. An integrated circuit device is formed, using traditional fabrication techniques on a front side of the substrate. Integrated passive components are then fabricated on the back side of the substrate.

In FIG. 4A, the substrate 401 has integrated circuit devices 403 fabricated upon the front side of the substrate 401. The integrated circuit devices 403 are optionally covered with a temporary coating 405. The temporary coating 405 protects the integrated circuit devices 403 for later processing steps which occur on the back side of the substrate 401. The temporary coating 405 may be, for example, an organic or metallic coating (e.g., photoresist or a deposited or sputtered metal layer).

In FIG. 4B, an optional dielectric material 407 is formed on the back side of the substrate 401. The optional dielectric material may be either an organic or inorganic material. In a specific exemplary embodiment, the optional dielectric material 407 is a high-k dielectric material (e.g., zirconium-doped tantalum oxide, zirconium oxide, tantalum pentoxide, etc.). A high-k dielectric layer increases the Q-factor of an inductor.

With reference to FIG. 4C, a metal seed layer 409 is applied to either the back side of the substrate 401 or to the optional dielectric material 407. The metal seed layer 409 forms a seed metal layer for additional layers. The metal seed layer 409 may be, for example, an electrolytically plated metal layers such as a titanium-tungsten-copper (TiW—Cu) layer. Skilled artisans will recognize that other metals may be selected. The metal seed layer 409 is then coated with photoresist. Various passive components may be patterned and etched leaving an etched photoresist layer 411.

Figure 4D:
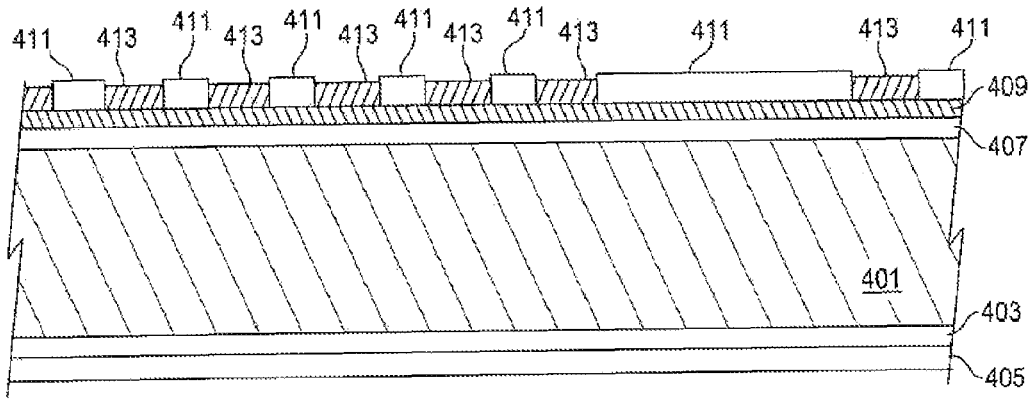

In FIG. 4D, a metal deposition 413 deposits metal into the open areas in the etched photoresist layer 411 thus forming a metal structure. The metal deposition 413 may be, for example, an electroplated layer comprised substantially of copper. Other techniques for forming one or more metal layers, for example, sputtering, may also be used. Additionally, other metals may be chosen so as to affect electrical characteristics of the passive component. For example, a metal having low conductivity may be used for forming resistive elements. Also, a combination of various metal types or metal alloys may be used in different geometric areas. A skilled artisan will recognize that certain types of metal may not require the metal seed layer 409. In these cases, a patterned photoresist 411 may be applied directly to the back side of the substrate 401 and metal applied (e.g., deposited, sputtered, etc.) without a need for either the optional dielectric material 407 or the metal seed layer 409. The choice of layers is dependent upon factors such as metal choice and metal-forming methods employed.

Figure 4E:
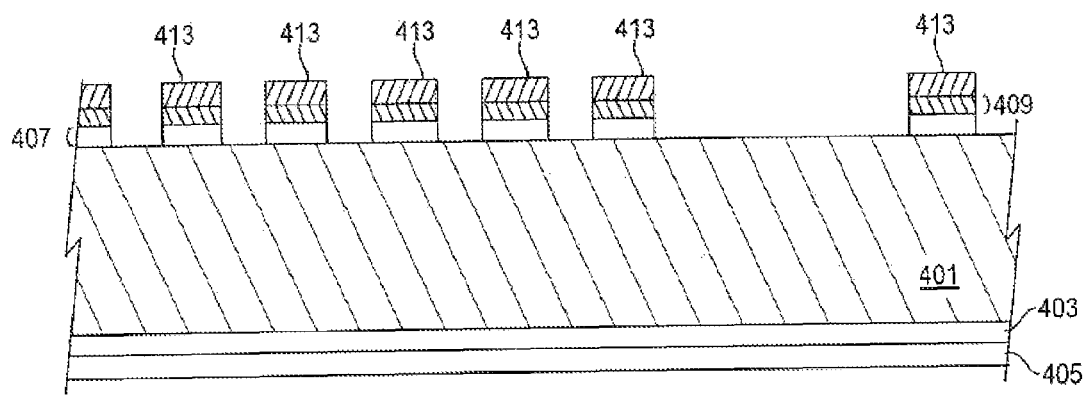
Figure 4F:
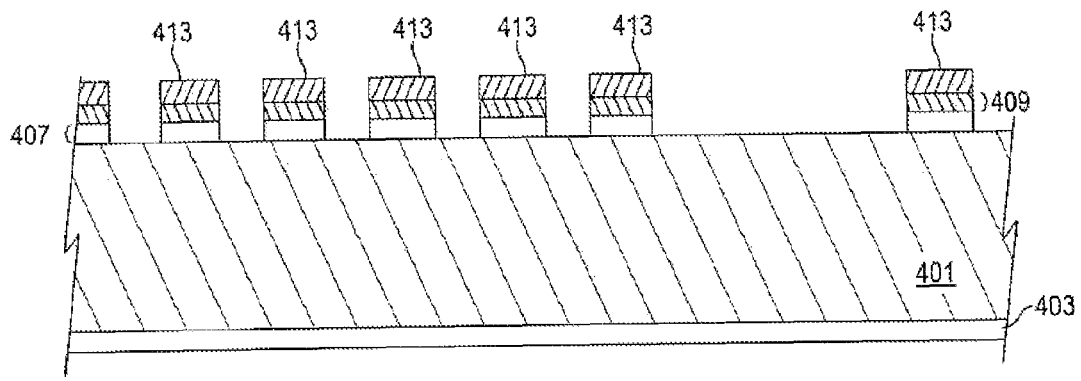

In FIG. 4E, the photoresist layer 411 may be stripped and exposed portions of the metal seed layer 409, if used, are etched. Alternatively, the photoresist layer 411 may simply be left in place. If present, exposed portions of the optional dielectric material 407 are also removed. The temporary coating 405 (FIGS. 4A-4E) is removed as illustrated in FIG. 4F.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that embodiments of the present invention may be readily used in various types of semiconductor packaging such as Dual Flat-Pack No-Lead (DFN), QTAPP® (thin array plastic package), ULGA® (ultra-thin land grid array), BCC® (bumped chip carrier), or other package types. The specification and drawings are, accordingly, to be regarded in an illustrative rather than a restrictive sense.

What is claimed is:

1. An integrated circuit comprising:
   a substrate including a front side and a back side, the front side of the substrate including one or more integrated circuit devices thereon;
   a dielectric material formed over the back side of the substrate;
   at least one inductor on the back side of the substrate, the at least one inductor including a metal deposition layer forming a metal structure, the at least one inductor terminating at two bond pads at either end of the inductor; and
   a metal seed layer between the dielectric material and the metal structure.

2. The integrated circuit of claim 1, wherein the metal structure includes copper.

3. The integrated circuit of claim 1, wherein the dielectric material is a high-k dielectric material.

4. The integrated circuit of claim 3, wherein the dielectric material includes zirconium.

5. The integrated circuit of claim 1, wherein the metal seed layer includes titanium-tungsten.

6. The integrated circuit of claim 1, wherein both of the bond pads are a same distance from the back side of the substrate.

7. The integrated circuit of claim 1, wherein the at least one inductor includes a high-Q inductor.

8. The integrated circuit of claim 1, wherein the at least one inductor includes various combinations of inductors with various sizes.

* * * * *

UNITED STATES PATENT AND TRADEMARK OFFICE
CERTIFICATE OF CORRECTION

| | | |
|---|---|---|
| PATENT NO. | : 8,258,599 B2 | Page 1 of 1 |
| APPLICATION NO. | : 11/456685 | |
| DATED | : September 4, 2012 | |
| INVENTOR(S) | : Ken M. Lam | |

It is certified that error appears in the above-identified patent and that said Letters Patent is hereby corrected as shown below:

Cover page, Column 2, (57) Abstract, Line 2, delete "integrtated" and insert -- integrated --, therefor.

Column 1, line 11, delete "20053." and insert -- 2005. --, therefor.

Column 2, line 62, delete "circuits" and insert -- circuit --, therefor.

Column 3, line 32, delete "2" and insert -- 2, --, therefor.

Signed and Sealed this
Sixth Day of November, 2012

David J. Kappos
*Director of the United States Patent and Trademark Office*